US007108959B2

(12) United States Patent
Maehashi

(10) Patent No.: US 7,108,959 B2
(45) Date of Patent: Sep. 19, 2006

(54) PRINTING PLATE MATERIAL IN ROLL FORM OF THE ON-PRESS DEVELOPMENT TYPE

(75) Inventor: Tatsuichi Maehashi, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 21 days.

(21) Appl. No.: 10/932,352

(22) Filed: Aug. 31, 2004

(65) Prior Publication Data

US 2005/0058942 A1 Mar. 17, 2005

(30) Foreign Application Priority Data

Sep. 11, 2003 (JP) ........................ JP2003-319532

(51) Int. Cl.
*G03F 7/11* (2006.01)

(52) U.S. Cl. ................. 430/271.1; 101/453; 101/463.1

(58) Field of Classification Search ................ 430/138, 430/270.1, 271.1, 302, 306, 309, 494; 101/453, 101/460, 463.1
See application file for complete search history.

(56) References Cited

U.S. PATENT DOCUMENTS 5,281,509 A 1/1994 Murakata et al.
5,496,677 A * 3/1996 Toyama et al. ............. 430/162
5,968,709 A 10/1999 Verschueren et al.
6,077,646 A * 6/2000 Verschueren et al. .... 430/272.1
6,749,993 B1 * 6/2004 Hiraoka ................... 430/273.1
6,796,236 B1 * 9/2004 Mori .......................... 101/460
6,844,138 B1 * 1/2005 Kita et al. .................. 430/302
2004/0218169 A1 * 11/2004 Maehashi .................... 355/85
2005/0011384 A1 * 1/2005 Sampei ....................... 101/483

FOREIGN PATENT DOCUMENTS

| | | |
|---|---|---|
| DE | 42 30 058 A1 | 3/1993 |
| EP | 0 543 441 A1 | 5/1993 |
| EP | 0 866 376 A1 | 9/1998 |
| EP | 04 02 0664 | 12/2004 |
| JP | 2000275851 | 10/2000 |
| JP | 2001026184 | 1/2001 |

* cited by examiner

*Primary Examiner*—Barbara L. Gilliam
(74) *Attorney, Agent, or Firm*—Lucas & Mercanti, LLP

(57) ABSTRACT

Disclosed is a printing plate material in roll form of the on-press development type comprising a support, a functional layer including a hydrophilic layer and a thermosensitive image formation layer provided on one side of the support, and a back coat layer provided on the other side of the support, the functional layer containing first matting agents and having first protrusions formed from the first matting agents, and the back coat layer containing second matting agents and having second protrusions formed from the second matting agents, wherein an average protrusion height of the first protrusions is 0.5 to 5.0 μm higher than that of the second protrusions.

7 Claims, No Drawings

PRINTING PLATE MATERIAL IN ROLL FORM OF THE ON-PRESS DEVELOPMENT TYPE

FIELD OF THE INVENTION

The present invention relates to a printing plate material in roll form of the on-press development type, which is marketed in roll form, and particularly to techniques for improving storage stability and printing properties of a printing plate material having an image formation mechanism comprising removing non-image portions of the printing plate material mounted on a printing press.

BACKGROUND OF THE INVENTION

In recent years, a computer to plate system (CTP), in which image data can be directly recorded in a printing plate material, has been widely used accompanied with the digitization of printing data. As a printing plate material usable for CTP, there are a printing plate material comprising an aluminum support such as a conventional PS plate, and a flexible printing plate material comprising a flexible resin film sheet and provided thereon, various functional layers. Recently, in the commercial printing industries, there is a tendency that many kinds of prints are printed in a small amount, and an inexpensive printing plate material with high quality has been required in the market. As a conventional flexible printing plate material, there are a silver salt diffusion transfer type printing plate material as disclosed in Japanese Patent O.P.I. Publication No. 5-66564, in which a silver salt diffusion transfer type light sensitive layer is provided on a flexible sheet; an ablation type printing plate material as disclosed in Japanese Patent O.P.I. Publication Nos. 8-507727, 6-186750, 6-199064, 7-314934, 10-58636 and 10-244773 in which a hydrophilic layer and a lipophilic layer, one of which is the outermost layer, are provided on a flexible sheet where the outermost layer is ablated by laser exposure to prepare a printing plate; and a heat melt type printing plate material as disclosed in Japanese Patent O.P.I. Publication No. 2001-96710 in which a hydrophilic layer and a heat melt image formation layer are provided on a flexible sheet where a hydrophilic layer or a heat melt image formation layer is imagewise heated by laser exposure to heat-fix the image formation layer onto the hydrophilic layer.

The silver salt diffusion transfer type printing plate material requires a wet development step and a drying step after exposure, which does not give sufficient dimensional accuracy during the image formation step, and is not suitable to obtain printed matter with high image quality.

The ablation type printing plate material does not require a wet development step, but image formation due to ablation is likely to fluctuate in dot shape. Further, there is problem in which the interior of the exposing apparatus or the printing plate surface is contaminated by scattered matters caused by ablation of the layer.

A process, comprising a step of forming on a hydrophilic layer a heat-melted image, heated by conversion from laser light, is suitable to obtain high precision images. Among types of this process, there is a so-called on-press development process in which when a printing plate material after image writing is mounted on an off-set press, and a dampening solution is supplied to the printing plate material during printing, only the image formation layer at non-image portions is swollen or dissolved by the a dampening solution, and transferred to a printing paper (paper waste), whereby the image formation layer at non-image portions is removed. This process does not require a special development after exposure, resulting in excellent stability of printing quality and excellently meeting environmental concern.

Generally, a printing plate material having a plastic film sheet as a support is placed in the roll form in an output apparatus and automatically cut to a given size there. A printing plate material for CTP having a plastic film sheet as a support may have a back coat layer for controlling electroconductivity, friction or surface shape on the surface of the support opposite the image formation layer in order to fix easily the printing plate material on an exposure drum or a plate cylinder.

When a printing plate material is wound around a core in roll form, the back coat layer and the image formation layer contact each other, and therefore, it is necessary that both layers be unaffected by each other. A method has been proposed which a matting agent is incorporated in a back coat layer of a printing plate material to control its coefficient of friction or surface shape of the back coat layer (see for example, Japanese Patent O.P.I. Publication No. 11-91256).

The technique disclosed in the Patent document above is a printing plate material in which when the printing plate material is wound around a core in the roll form, and stored for a long time, a spotted pressure due to protrusions derived from the matting agent is applied to the image formation layer, resulting in lowering of printing image quality such as stain occurrence at non-image portions. It has been found that particularly in a printing plate material of the on-press development type comprising a plastic sheet support, a functional layer comprised of a hydrophilic layer and a thermosensitive image formation layer provided on one side of the support, and a back coat layer provided on the other side of the support, which is put on the market in the roll form, there occur phenomenon that development speed partially decreases and ink transfer to image portions is non-uniform. Further, it has been found that particularly when ink containing no petroleum volatile solvent (for example, soybean oil ink), which has been widely used in view of environmental protection, is employed, ink transfer to image portions is more non-uniform.

SUMMARY OF THE INVENTION

An object of the invention is to provide a printing plate material in roll form of the on-press development type having improved storage stability, and giving a constant developing speed and good printing quality, wherein the printing plate material is put on the market in roll form.

DETAILED DESCRIPTION OF THE INVENTION

The above object has been attained by one of the following constitutions:

1. A printing plate material in roll form of the on-press development type comprising a support, a functional layer including a hydrophilic layer and a thermosensitive image formation layer provided on one side of the support, and a back coat layer provided on the other side of the support, the functional layer containing first matting agents and having first protrusions formed from the first matting agents, and the back coat layer containing second matting agents and having second protrusions formed from the second matting agents, wherein an average protrusion height of the first protrusions is 0.5 to 5.0 μm higher than that of the second protrusions.

2. The printing plate material in roll form of the on-press development type of item 1 above, wherein the ratio of a protrusion frequency of the first protrusions to that of the second protrusions is from 130 to 500%.

3. The printing plate material in roll form of the on-press development type of item 1 above, wherein the functional layer contains the first matting agents having an average particle diameter of 1.0 to 15 μm in an amount of from 0.2 to 5.0 g/$m^2$, and the back coat layer contains the second matting agents having an average particle diameter of 1.0 to 10 μm in an amount of from 0.01 to 1.0 g/$m^2$.

4. The printing plate material in roll form of the on-press development type of item 3 above, wherein the first matting agents have an average particle diameter of 4.0 to 10 μm, and the second matting agents have an average particle diameter of 3.0 to 8 μm.

5. The printing plate material in roll form of the on-press development type of item 1 above, wherein the functional layer has a thickness of from 0.5 to 5 μm, and the back coat layer has a thickness of from 0.5 to 5.0 μm.

6. The printing plate material in roll form of the on-press development type of item 1 above, wherein the hydrophilic layer has a thickness of from 1.0 to 3.5 μm, and the thermosensitive image formation layer has a thickness of from 0.3 to 1.5 μm.

7. The printing plate material in roll form of the on-press development type of item 1 above, wherein the thermosensitive image formation layer contains heat melt particles or heat fusible particles.

8. The printing plate material in roll form of the on-press development type of item 1 above, wherein the hydrophilic layer contains a light-to-heat conversion material.

9. The printing plate material in roll form of the on-press development type of item 1 above, wherein the hydrophilic layer contains the first matting agents.

10. The printing plate material in roll form of the on-press development type of item 1 above, wherein the functional layer consists of a hydrophilic layer and a thermosensitive image formation layer being provided on the support in that order.

The printing plate material of the invention is a printing plate material in roll form of the on-press development type comprising a support, a functional layer including a hydrophilic layer and a thermosensitive image formation layer provided on one side of the support, and a back coat layer provided on the other side of the support, wherein the printing plate material is marketed in roll form. Herein, "on-press development" refers to development in which a part of a functional layer of a printing plate material mounted on a printing press is removed with a a dampening solution and/or printing ink, whereby the printing plate material is developed without employing a special developer, which is a development process well known in the art.

In the invention, the printing plate material of the invention is characterized in that the functional layer contains first matting agents and has first protrusions formed from the first matting agents, and the back coat layer contains second matting agents and has second protrusions formed from the second matting agents, wherein an average protrusion height of the first protrusions is 0.5 to 5.0 μm higher than that of the second protrusions. The term, "functional layer" refers to a layer participating in formation of image portions and non-image portions of a printing plate. The functional layer in the invention is typically a combined layer of a hydrophilic layer and an image formation layer, which are described later.

In the invention, the average protrusion height of the first protrusions on the functional layer side is 0.5 to 5.0 μm higher than that of the second protrusions on the back coat layer side. When the average protrusion height of the first protrusions is higher that of the second protrusions by less than 0.5 μm, it results in insufficient storage stability.

Herein, "the height of the protrusions" refers to a difference from the surface of the layer where protrusions are not present to the peak of protrusions in the matting agent-containing layer.

In the invention, the thickness of the matting agent-containing layer (the functional layer or back coat layer) and the average height of protrusions are determined according to the following method. A coating solution for a matting agent-containing layer is coated on a 100 μm thick polyethylene terephthalate (PET) film and dried to give a layer with a predetermined thickness. Then, the shape of the boundary between the uncoated and coated portions of the resulting coated sample is measured employing a contact three dimensional surface shape measuring system WYKO NT-2000 produced by Veeco Co., Ltd.

In the invention, thickness of the matting agent-containing layer is represented in terms of a distance from the PET film surface to the surface (opposite the PET film surface) of the coated layer where the protrusions (matting agents) do not exist.

Heights of ten protrusions in the coated layer are measured, and the average is defined as the average height of protrusions.

In the invention, the ratio of a protrusion frequency per unit area of the matting agents contained in the functional layer to that of the matting agents contained in the back coat layer is preferably from 130 to 500% in view of storage stability.

In the invention, the protrusion frequency per unit area of protrusions in the matting agent-containing layer is determined according to the following method. A coating solution for the matting agent-containing layer is coated on a 100 μm thick polyethylene terephthalate (PET) film and dried to give a matting agent-containing layer with a predetermined thickness. Then, the coated surface of the resulting coated sample is observed with a 400-power optical microscope, and the number of protrusions within the field of vision is counted. The number of protrusions at ten portions of the coated surface is counted, the average number is calculated, and then, the average number per unit area is calculated as the protrusion frequency per unit area of the protrusions.

In the invention, the average particle diameter of the matting agent contained in the functional layer is at maximum 10 μm, and preferably at maximum 8 μm. The lower limit of the average particle diameter of the matting agent is determined according to thickness of the functional layer, but generally 4 μm, and preferably 5 μm. The matting agent having the average particle diameter falling within the range as described above is preferred in view of resolving power and storage stability.

Herein, the matting agent with an average particle diameter of at maximum 10 μm contained in the functional layer means that when the functional layer contains two or more kinds of the matting agent having a different average particle diameter, the average particle diameter of the matting agent having the largest average particle diameter is at maximum 10 μm, and when the functional layer contains only one kind of the matting agent, the average particle diameter of the matting agent is at maximum 10 μm.

In the invention, the average particle diameter of the matting agent is determined according to the following procedure. In the particle size distribution curve, which is measured employing a laser particle size distribution measuring apparatus SALD-2100 produced by Shimazu Co., Ltd., a particle diameter giving a relative particle amount of 50% is defined as the average particle diameter of the matting agent.

In the invention, the ratio of the functional layer thickness to the average diameter of matting agents contained in the functional layer is preferably from 1:1.1 to 1:1.5, and more preferably from 1:1.2 to 1:1.3, and the ratio of the back coat layer thickness to the average diameter of matting agents contained in the back coat layer is preferably from 1:1.1 to 1:1.5, and more preferably from 1:1.2 to 1:1.3.

The functional layer in the invention comprises a hydrophilic layer and a thermosensitive image formation layer. It is preferred in the invention that the printing plate material comprises a support, a hydrophilic layer (which may be plural) and a thermosensitive layer provided on the support in that order, and a back coat layer provided on the surface of the support opposite the image formation layer.

The hydrophilic layer, thermosensitive image formation layer, back coat layer and support will be explained below.

<Hydrophilic Layer>

The hydrophilic layer in the invention may be comprised of a single layer or plural layers. The thickness of the hydrophilic layer, which is determined according to the method described above, is ordinarily from 0.5 to 5.0 μm, and preferably from 1.0 to 3.5 μm.

In the invention, the functional layer contains a matting agent, and it is preferred that the hydrophilic layer contains a matting agent. The average particle diameter of the matting agent is preferably 1.1 to 5 times, and more preferably 1.2 to 3 times the thickness of the functional layer. The average particle diameter of the matting agent is different due to the thickness of the functional layer (or the total thickness of the hydrophilic layer and thermosensitive layer). For example, when the thickness of the functional layer is from 0.5 to 5.0 μm, average particle diameter of the matting agent is preferably from 1.0 to 15 μm, more preferably from 2.0 to 12 μm, and still more preferably 4.0 to 10 μm.

The matting agent content of the functional layer is different due to the density or average particle diameter of the matting agent used or the matting agent content of the back coat layer, but is generally from 0.1 to 3.0 g/m$^2$, preferably from 0.2 to 2.0 g/m$^2$, and more preferably from 0.3 to 1.0 g/m$^2$.

It is preferred in the printing plate material of the invention that the ratio of the protrusion frequency per unit area of protrusions in the functional layer to that of protrusions in the back coat layer is from 130 to 500%. For example, such a printing plate material as above is prepared so that the back coat layer contains a matting agent with an average particle diameter of from 1.0 to 10 μm and preferably from 3.0 to 8.0 μm in an amount of from 0.01 to 1.0 g/m$^2$ and preferably from 0.03 to 0.5 g/m$^2$, and the functional layer contains a matting agent with an average particle diameter of preferably from 1.0 to 15 μm, more preferably from 2.0 to 12 μm, and still more preferably from 4.0 to 10.0 μm in an amount of preferably from 0.2 to 5.0 g/m$^2$ and more preferably from 0.5 to 3.0 g/m$^2$.

As the matting agent contained in the functional layer, various known matting agents can be used as long as they have the average particle diameter as described above. Examples thereof include inorganic particles such as particles of silica, aluminosilicate, titania or zirconia; resin particles such as particles of polymethyl methacrylate (PMMA) resin, styrene resin, melamine resin, or silicone resins; and particles in which the surface of the above particles are subjected to hydrophilization treatment employing silica, etc.

The hydrophilic layer in the invention is preferably a layer in which particles are dispersed in a hydrophilic matrix. As material in the hydrophilic matrix is preferably used an organic hydrophilic matrix obtained by cross-linking or pseudo cross-linking an organic hydrophilic polymer, an inorganic hydrophilic matrix obtained by sol-to-gel conversion by hydrolysis or condensation of polyalkoxysilane, titanate, zirconate or aluminate, or metal oxides. The hydrophilic matrix layer preferably contains metal oxide particles. Examples of the metal oxide particles include particles of colloidal silica, alumina sol, titania sol and another metal oxide sol.

The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment. The metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred. The colloidal silica has a high layer forming ability under a drying condition with a relative low temperature, and can provide a good layer strength. It is preferred that the colloidal silica used in the invention is necklace-shaped colloidal silica or colloidal silica particles having an average particle size of not more than 20 nm, each being described later. Further, it is preferred that the colloidal silica provides an alkaline colloidal silica solution as a colloid solution.

The hydrophilic matrix in the invention may have a porous structure, and can contain, as porosity providing agents, porous metal oxide particles with a particle size of less than 1 μm. Examples of the porous metal oxide particles include porous silica particles, porous aluminosilicate particles or zeolite particles as described later. The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions. The porous silica particles prepared from the gel by the wet method is particularly preferred.

The porosity of the particles is preferably not less than 1.0 ml/g, more preferably not less than 1.2 ml/g, and most preferably of from 1.8 to 2.5 ml/g, in terms of pore volume. The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

Zeolite is a crystalline aluminosilicate, which is a porous material having voids of a regular three dimensional net work structure and having a pore size of 0.3 to 1 nm. Natural and synthetic zeolites are expressed by the following formula.

$$(M_1.(M_2)^{1/2})_m(Al_mSi_nO_{2(m+n)}).xH_2O$$

In the above, $M_1$ and $M_2$ are each exchangeable cations. Examples of $M_1$ include $Li^+$, $Na^+$, $K^+$, Tl+, $Me_4N^+$ (TMA), $Et_4N^+$ (TEA), $Pr_4N^+$ (TPA), $C_7H_{15}N^{2+}$, and $C_8H_{16}N^+$, and examples of $M^2$ include $Ca^{2+}$, $Mg^{2+}$, $Ba^{2+}$, $Sr^{2+}$ and $C_8H_{18}N_2^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}).27H_2O$; Al/Si=1.0, Zeolite X: $Na_{86}(Al_{86}Si_{106}O_{384}).264H_2O$; Al/Si=0.811, and Zeolite Y: $Na_{56}(Al_{56}Si_{136}O_{384}).250H_2O$; Al/Si=0.412. Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered. The particle diameter of the particles in the hydrophilic layer (including particles subjected to dispersion processing) is preferably is not more than 1 μm, and more preferably not more than 0.5 μm.

The hydrophilic layer in the invention can contain layer structural clay mineral particles. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable. An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the planar structural mineral particles, the particles have an average particle size (an average of the largest particle length) of preferably not more than 20 μm, and more preferably not more than 10 μm, and an average aspect ratio (the largest particle length/the particle thickness of preferably not less than 20, and more preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect. The particle size greater than the foregoing may produce a non-uniform coated layer, resulting in poor layer strength. The aspect ratio lower than the foregoing reduces the planar particles, resulting in insufficient viscosity increase and reduction of particle sedimentation inhibiting effect. The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate can be used as another additive in the hydrophilic layer in the invention. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

A water soluble resin may be contained in the hydrophilic layer in the invention. Examples of the water soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the invention, polysaccharides are preferably used as the water soluble resin.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer preferably has a convexoconcave structure having a pitch of from 0.1 to 50 μm such as the grained aluminum surface of an aluminum PS plate. The water retention ability and the image maintaining ability are raised by such a convexoconcave structure of the surface. Such a convexoconcave structure can also be formed by adding in an appropriate amount of particles having a suitable particle size to the coating liquid of the hydrophilic layer, or by coating a coating liquid for the hydrophilic layer containing the alkaline colloidal silica and the water-soluble polysaccharide so that the phase separation occurs at the time of drying the coated liquid. The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

In the invention, an intermediate hydrophilic layer can be provided between the hydrophilic layer and the support. As materials used for the intermediate hydrophilic layer, the same as those used in the hydrophilic layer described above can be used. However, that the intermediate hydrophilic layer is porous is not so advantageous. It is preferred that the intermediate hydrophilic layer is non-porous in view of layer strength. Therefore, the content of porosity providing agents in the intermediate hydrophilic layer is preferably lower than that in the hydrophilic layer, and it is more preferred that intermediate hydrophilic layer contains no porosity providing agents.

In the invention, the hydrophilic layer or intermediate hydrophilic layer can contain a light-to-heat conversion material. As the light-to-heat conversion materials, infrared absorbing dyes, inorganic or organic pigment and metal oxides are preferably used. Typical examples thereof are as follows.

Examples of the infrared absorbing dyes include organic compounds such as a cyanine dye, a chloconium dye, a polymethine dye, an azulenium dye, a squalenium dye, a thiopyrylium dye, a naphthoquinone dye and an anthraquinone dye; and organometallic complexes of phthalocyanine type, naphthalocyanine type, azo type, thioamide type, dithiol type or indoaniline type. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm. The graphite is one having a particle size of preferably not more than 0.5 μm, more preferably not more than 100 nm, and most preferably not more than 50 nm. As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred. As the metal oxide, materials having black color in the visible regions, or electro-conductive materials or semi-conductive materials can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. The particle size of these particles is preferably not more than 0.5 μm, more preferably not more than 100 nm, and most preferably not more than 50 nm.

Of these light-to-heat conversion materials, black iron oxide and black complex metal oxides containing at least two metals are preferred. Examples of the latter include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light-to-heat conversion efficiency as compared with another metal oxide.

The primary average particle size of these metal oxide light-to-heat conversion materials is preferably not more than 1 μm, and more preferably from 0.01 to 0.5 μm. The primary average particle size of not more than 1 μm improves light-to-heat conversion efficiency relative to the addition amount of the particles, and the primary average particle size of from 0.05 to 0.5 μm further improves a light-to-heat conversion efficiency relative to the addition amount of the particles. The light-to-heat conversion efficiency relative to the addition amount of the particles depends on a dispersity of the particles, and the well-dispersed particles have a high light-to-heat conversion efficiency. Accordingly, these metal oxide light-to-heat conversion materials are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of metal oxide particles. The addition amount of the metal oxide particles is preferably 0.1 to 60% by weight, more preferably 3 to 60% by weight, and most preferably 3 to 45% by weight based on the weight of the hydrophilic layer or the intermediate layer. The content of the light-to-heat conversion material in the hydrophilic layer may be different from that in the intermediate hydrophilic layer.

<Thermosensitive Image Formation Layer>

The thickness of the thermosensitive image formation layer in the invention is ordinarily from 0.3 to 1.5 μm, and preferably from 0.4 to 1.0 μm. Herein, the thickness of the thermosensitive image formation layer is a value obtained according to the measuring method described above.

The thermosensitive image formation layer in the invention preferably contains heat melt particles and/or heat fusible particles.

The heat melt particles are particularly particles having a low melt viscosity, or particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable. Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to contaminations which may be caused by scratch is further enhanced.

The heat melt particles are preferably dispersible in water. The average particle size thereof is preferably from 0.01 to 10 μm, and more preferably from 0.1 to 3 μm. When a layer containing the heat melt particles is coated on a porous hydrophilic layer described later, the particles having an average particle size less than 0.01 μm may enter the pores of the hydrophilic layer or the valleys between the neighboring two peaks on the hydrophilic layer surface, resulting in insufficient on press development and background contaminations. The particles having an average particle size exceeding 10 μm may result in lowering of dissolving power. The composition of the heat melt particles may be continuously varied from the interior to the surface of the particles. The particles may be covered with a different material. Known microcapsule production method or sol-gel method can be applied for covering the particles. The heat melt particle content of the thermosensitive image formation layer is preferably 1 to 90% by weight, and more preferably 5 to 80% by weight based on the total layer weight.

The heat fusible particles include particles of a thermoplastic hydrophobic polymer. There is no specific limitation to the upper limit of the softening point of the thermoplastic hydrophobic polymer. It is preferred that the softening point of the thermoplastic hydrophobic polymer is lower than the decomposition temperature of the polymer. The weight average molecular weight (Mw) of the polymer is preferably within the range of from 10,000 to 1,000,000.

Examples of the thermoplastic hydrophobic polymer constituting the particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co) polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co) polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The hydrophobic polymer may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm. When a layer containing the heat fusible particles having an average particle size less than 0.01 μm is coated on the porous hydrophilic layer, the particles may enter the pores of the hydrophilic layer or the valleys between the neighboring two peaks on the hydrophilic layer surface, resulting in insufficient on press development and background contaminations. The heat fusible particles having an average particle size exceeding 10 μm may result in lowering of dissolving power. Further, the composition of the heat fusible particles may be continuously varied from the interior to the surface of the particles. The particles may be covered with a different material. As a covering method, known methods such as a microcapsule method and a sol-gel method are usable. The heat fusible particle content of the thermosensitive image formation layer is preferably from 1 to 90% by weight, and more preferably from 5 to 80% by weight based on the total weight of the layer.

In the invention, the thermosensitive image formation layer can further contain a water soluble material. When an image formation layer at unexposed portions is removed on a press with a dampening solution or ink, the water soluble material makes it possible to easily remove the layer. Regarding the water soluble material, those described above as water soluble materials to be contained in the hydrophilic layer can be used. The image formation layer in the invention preferably contains saccharides, and more preferably contains oligosaccharides. Among the oligosaccharides, trehalose with comparatively high purity is available on the market, and has an extremely low hygroscopicity, although it has high water solubility, providing excellent storage stability and excellent development property (on-press development) on a printing press. When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring. In order to attain the object of the invention, trehalose is preferable among oligosaccharides. The oligosaccharide content of the thermosensitive image formation layer is preferably from 1 to 90% by weight, and more preferably from 10 to 80% by weight, based on the total weight.

<Back Coat Layer>

A back coat layer is provided on the rear surface of the printing plate material of the on-press development type of the invention in order to obtain desired smoothness, coefficient of static friction and electroconductivity. as defined in the invention. The thickness of the back coat layer is ordinarily from 0.5 to 5.0 μm, and preferably from 1.0 to 3.0 μm.

In the invention, the back coat layer contains a matting agent. The average diameter of the matting agent is preferably 1.1 to 5 times the thickness of the back coat layer, and more preferably 1.2 to 3 times the thickness of the back coat layer. The desired particle diameter of the matting agent is different due to the back coat layer thickness. When the back coat layer thickness is 1.0 to 3.0 μm, the particle diameter of the matting agent is preferably from 2.0 to 10 μm, and more preferably from 3.0 to 8.0 μm.

The matting agent content of the back coat layer is different due to the average particle diameter of the matting agent or the matting agent content of the functional layer, but is ordinarily from 0.01 to 1.0 $g/m^2$, and preferably from 0.03 to 0.5 $g/m^2$.

As the matting agent, various known matting agents can be used as long as they have the average particle diameter as described above. Examples thereof include particles of silicone resins, acryl resins, polymethyl methacrylate (PMMA) resin, melamine resins, polystyrene resin, polyethylene resin, polypropylene resin, and fluorine-contained resins. Of these, particles of polymethyl methacrylate (PMMA) resin are especially preferred. Examples of the inorganic particles include particles of silicon oxide, calcium carbonate, titanium dioxide, aluminum oxide, zinc oxide, barium sulfate, and zinc sulfate. Of these, titanium dioxide, calcium carbonate, and silicon oxide are preferred.

It is preferred that the back coat layer contains a compound providing good surface lubricity or good conductivity, in addition to a binder, or the matting agent.

Examples of the binder include gelatin, polyvinyl alcohol, methylcellulose, acetylcellulose, aromatic polyamides, silicone resins, alkyd resins, phenol resins, melamine resins, fluorine-contained resins, polyimides, urethane resins, acryl resins, urethane-modified silicone resins, polyethylene, polypropylene, Teflon (R), polyvinyl butyral, polyvinyl chloride, polyvinyl acetate, polycarbonates, organic boron compounds, aromatic esters, fluorinated polyurethane, polyether sulfone, polyesters, polyamides, polystyrene, and a copolymer containing as a main component a monomer unit contained in the resins or polymers described above. Use of a cross-linked polymer as a binder is effective in preventing separation of the matting agent or improving scratch resistance in the back coat layer, and is effective for preventing blocking during storage. As the cross-linking method of the binder, heat, actinic light, pressure or their combination can be employed according to kinds of the cross-linking agent used, without special limitations. In order to improve adhesion of the support, an adhesive layer may be provided between the substrate and the back coat layer.

The back coat layer preferably contains various surfactants, silicone oil, a fluorine-contained resin, or waxes, in order to improve lubricity of the surface.

An antistatic agent can be added to the back coat layer, in order to prevent transportation fault due to frictional electrification or adherence of foreign matter due to the electrification. Examples of the antistatic agent include a cationic surfactant, an anionic surfactant, a nonionic surfactant, a polymer antistatic agent, and electrically conductive particles. Of these, carbon black, graphite, particles of metal oxides such as tin oxide, zinc oxide or titanium oxide, or a conductive particles of semiconductors are preferably used. Carbon black, graphite, or particles of metal oxides are especially preferred, since a stable antistatic property can be obtained free from ambient conditions such as temperature.

Examples of the metal oxides constituting the metal oxide particles include $SiO_2$, ZnO, $TiO_2$, $SnO_2$, $Al_2O_3$, $In_2O_3$, MgO, BaO, $MoO_3$, $V_2O_5$ and a composite thereof, and metal oxides containing a hetero atom. These may be used singly or in combination. The preferred metal oxides of these are $SiO_2$, ZnO, $SnO_2$, $Al_2O_3$, $TiO_2$, $In_2O_3$, and MgO. Examples of the metal oxides containing a hetero atom include ZnO doped with a hetero atom such as Al or In, $SnO_2$ doped with a hetero atom such as Sb or Nb, and $In_2O_3$ doped with a hetero atom such as Sn, in which the doping content of the hetero atom is not more than 30 mol %, and more preferably not more than 10 mol %. The metal particle content of the back coat layer is preferably from 10 to 90% by weight. The average particle size of the metal particles is preferably from 0.001 to 0.5 μm. The average particle size of the metal particles herein refers to that of the metal particles including primary order particles and higher order particles.

The printing plate material of the on-press development type of the invention preferably comprises a layer or a support each having a specific surface resistance of from $1\times10^8$ to $1\times10^{12}$ $\Omega/m^2$ at 80% RH. Anti-static agents are preferably used. Various surfactants or electrically conductive materials as the anti-static agents are suitably used in the layer so that the layer has specific surface resistance of from $1\times10^8$ to $1\times10^{12}$ $\Omega/m^2$ at 80% RH. It is preferred that carbon black, graphite, or particles of metal oxides are added to a layer so that the layer has a specific surface resistance of from $1\times10^8$ to $1\times10^{12}$ $\Omega/m^2$ at 80% RH.

When the printing plate material of the invention on the fixing member is exposed to laser, the printing plate material is preferably fixed on the fixing member so that displacement of the printing plate material is not caused, employing a combination of a vacuum suction method and another known method. In order to prevent blocking or to provide good fixation, the rear surface of the support is preferably roughened or is preferably provided with a back coat layer containing a matting agent. Such a rear surface has a surface roughness (Rz) of preferably from 0.04 to 5.00 μm.

The smoother value of the back coat layer of the printing plate material is preferably not more than 0.06 MP, and more preferably from 0.0003 to 0.06 MP. The smoother value less than 0.0003 MP lowers uniform fixing on a fixing member and requires long time to obtain stable fixation. The smoother value more than 0.06 MP results in insufficient fixing and results in instable exposure. A coefficient of static friction between the back coat layer and the fixing member surface is preferably from 0.2 to 0.6. A coefficient of static friction less than 0.2 and a coefficient of static friction more than 0.6, both lower fixing accuracy.

<Support>

The support used in the printing plate material of the on-press development type of the invention is a metal foil, a paper sheet, a plastic sheet or a composite thereof. Of these, the plastic sheet is more preferred in view of ease in handling. In the printing plate material of the invention, the thickness of the support is preferably from 150 to 250 μm, and more preferably from 175 to 200 μm, in view of transportability in a printing plate manufacturing device and ease in handling as a printing plate material. Examples of the plastic sheet include sheets of polyethylene terephthalate, polyethylene naphthalate, polyimide, polyamide, polycarbonate, polysulfone, polyphenylene oxide, and cellulose ester. The plastic sheet is preferably a polyethylene terephthalate sheet or a polyethylene naphthalate sheet. It is preferred that an anti-static layer is provided on one side or on both sides of the support. When the anti-static layer is provided between the hydrophilic layer and the support, adhesion of the support to the hydrophilic layer is increased. The antistatic layer contains a polymer layer in which metal oxide particles or matting agents are dispersed. Examples of the metal oxides constituting the metal oxide particles include $SiO_2$, ZnO, $TiO_2$, $SnO_2$, $Al_2O_3$, $In_2O_3$, MgO, BaO, $MoO_3$, $V_2O_5$ and a composite thereof, and these metal oxides further containing hetero atoms. These may be used singly or in combination. The preferred metal oxides are $SiO_2$, ZnO, $SnO_2$, $Al_2O_3$, $TiO_2$, $In_2O_3$, and MgO. The thickness of the antistatic layer is preferably from 0.01 to 1 μm.

In order to increase adhesion between the substrate and a hydrophilic layer, the surface of the plastic sheet may be subjected to corona discharge treatment, flame treatment, plasma treatment and UV light irradiation treatment. The surface can be mechanically roughened according to a sand blast method or a brush roughening method. The plastic sheet is preferably coated with a subbing layer containing latex having a hydrophilic group or a water soluble resin.

<Image Formation Method>

One embodiment of the image formation method in the invention will be explained below.

Image formation on the printing plate material of the on-press development type of the invention can be carried out by applying heat, and is carried out preferably by infrared ray exposure. In the invention, exposure for image formation is preferably scanning exposure, which is carried out employing a laser which can emit light having a wavelength of infrared and/or near-infrared regions, that is, a wavelength of from 700 to 1000 nm. As the laser, a gas laser can be used, but a semi-conductor laser, which emits light having a near-infrared region wavelength, is preferably used.

A device suitable for the scanning exposure in the invention may be any device capable of forming an image on the printing plate material according to image signals from a computer employing a semi-conductor laser.

Generally, the scanning exposures include the following processes.

(1) a process in which a plate material provided on a fixed horizontal plate is scanning exposed in two dimensions, employing one or several laser beams.

(2) a process in which the surface of a plate material provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate material provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate material mounted on a plate cylinder of a printing press is scanning exposed.

EXAMPLES

The present invention will be detailed employing the following examples, but the invention is not limited thereto. In the examples, "parts" is parts by weight, unless otherwise particularly specified.

Example 1

<Preparation of Plastic Support>

Employing terephthalic acid and ethylene glycol, polyethylene terephthalate having an intrinsic viscosity VI of 0.66 (at 25° C. in a phenol/tetrachloroethane (6/4 by weight) solvent) was prepared according to a conventional method. The resulting polyethylene terephthalate was formed into pellets, dried at 130° C. for 4 hours, and melted at 300° C. The melted polyethylene terephthalate was extruded from a T-shaped die to obtain an unstretched film sheet. The resulting film sheet was biaxially heat-stretched at a specific temperature to obtain a polyethylene terephthalate support with a thickness of 175±3 μm.

<Preparation of Subbed Support>

The both surfaces of the support obtained above were corona discharged under condition of 8 $W/m^2$·minute. Then, the surface on one side of the support was coated with the following subbing layer coating solution (a) to give a first subbing layer with a dry thickness of 0.8 μm, and then coated with the following subbing layer coating solution (b) to give a second subbing layer with a dry thickness of 0.1 μm, while the first subbing layer was corona discharged under condition of 8 $W/m^2$·minute, each layer was dried at 180° C. for 4 minutes (subbing layer A was formed). Successively, the surface on the other side of the resulting support was coated with the following subbing layer coating solution (c) to give a third subbing layer with a dry thickness of 0.8 μm, and then coated with the following subbing layer coating solution (d) to give a fourth subbing layer with a dry thickness of 1.0 μm, while the third subbing layer was corona discharged under condition of 8 $W/m^2$·minute, each layer was dried at 180° C. for 4 minutes (subbing layer B was formed). The surface roughness Ra of the surface on the subbing layer B side was 0.8 μm.

| <<Subbing Layer Coating Solution (a)>> | |
|---|---|
| Latex of styrene/glycidyl methacrylate/butyl acrylate (60/39/1) copolymer (Tg = 75° C.) | 6.3 parts (in terms of solid content) |

-continued

| | |
|---|---|
| Latex of styrene/glycidyl methacrylate/butyl acrylate | 1.6 parts |
| (20/40/40) copolymer | (in terms of solid content) |
| Anionic surfactant S-1 | 0.1 parts |
| Water | 92.0 parts |

<<Subbing Layer Coating Solution (b)>>

| | |
|---|---|
| Gelatin | 1.0 part |
| Anionic surfactant S-1 | 0.05 parts |
| Hardener H-1 | 0.02 parts |
| Matting agent (Silica particles | 0.02 parts |
| with an average particle size of 3.5 μm) | |
| Antifungal agent F-1 | 0.01 parts |
| Water | 98.9 parts |

S-1

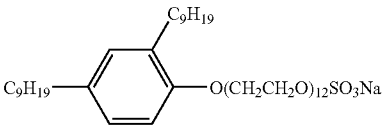

H-1

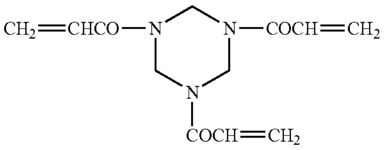

F-1

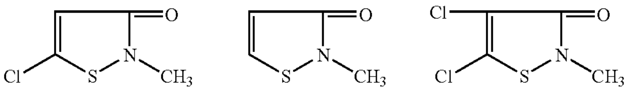

(Component A) (Component B) (Component C)

(Component A): (Component B): (Component C) = 50:46:4 (by mole)

<<Subbing Layer Coating Solution (c)>>

| | |
|---|---|
| Latex of styrene/glycidyl methacrylate/butyl acrylate | 0.4 parts |
| (20/40/40) copolymer | (in terms of solid content) |
| Latex of styrene/glycidyl methacrylate/butyl | 7.6 parts |
| acrylate/acetoacetoxyethyl methacrylate (39/40/20/1) | (in terms of solid content) |
| copolymer | |
| Anionic surfactant S-1 | 0.1 parts |
| Water | 91.9 parts |

<<Subbing Layer Coating Solution (d)>>

| | |
|---|---|
| Conductive composition of | |
| * Component d-1/Component d-2/Component d-3 | 6.4 parts |
| (=66/31/1) | |
| Hardener H-2 | 0.7 parts |
| Anionic surfactant S-1 | 0.07 parts |

-continued

| | |
|---|---|
| Silica particles<br>with an average particle size of 3.5 μm) | 0.03 parts |
| Water | 93.4 parts |

* Component d-1
Copolymer of styrene sulfonic acid/maleic acid (50/50)
(Anionic polymer)
* Component d-2
Latex of styrene/glycidyl methacrylate/butyl acrylate
(20/40/40) copolymer
* Component d-3
Copolymer of styrene/sodium isoprene sulfonate (80/20)
(Polymer surfactant)
H-2
Mixture of three compounds below

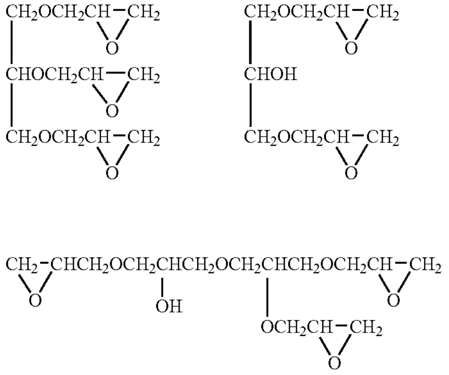

<Preparation of Printing Plate Material Sample>

(Preparation of Printing Plate Material Sample 1)

A hydrophilic layer 1 coating solution as shown in Table 1, a hydrophilic layer 2 coating solution as shown in Table 1, and an image formation layer coating solution as shown in Table 3 were coated on the surface of the subbing layer A side of the subbed support obtained above, employing a wire bar, and a back coat layer coating solution as shown in Table 4 was coated on the surface of the subbing layer B side of the subbed support obtained above, employing a wire bar.

In the above, the hydrophilic layer 1 coating solution and the hydrophilic layer 2 coating solution (Table 1) were coated on the surface of the subbing layer A side with a wire bar in that order to obtain a hydrophilic layer 1 with a dry thickness of 3.0 g/m$^2$ and a hydrophilic layer 2 with a dry thickness of 0.6 g/m$^2$, dried at 120° C. for 1 minutes, and then heat treated at 60° C. for 4 hours. Thereafter, the back coat layer coating solution was coated on the surface of the subbing layer B side with a wire bar to obtain a back coat layer with a dry thickness of 2.0 g/m$^2$, dried at 120° C. for 30 seconds. Subsequently, the image formation layer coating solution was coated on the hydrophilic layer 2 with a wire bar to obtain an image formation layer with a dry thickness of 0.5 g/m$^2$, dried at 70° C. for 1 minute, and then subjected to seasoning treatment at 50° C. for 48 hours.

<<Hydrophilic Layer 1 Coating Solution>>

Materials as shown in Table 1 were sufficiently mixed in the amounts shown in Table 1 while stirring, employing a homogenizer, and filtered to obtain hydrophilic layer 1 coating solution. Details of the materials are shown in Table 1, and in Table 1, numerical values represent parts by weight.

TABLE 1

| Materials | Amount (parts by weight) |
|---|---|
| Colloidal silica (alkali type): Snowtex XS (solid 20% by weight, produced by Nissan Kagaku Co., Ltd.) | 240.5 |
| Colloidal silica (alkali type): Snowtex ZL (solid 20% by weight, produced by Nissan Kagaku Co., Ltd.) | 15 |
| Matting agent: STM-6500S produced by Nissan Kagaku Co., Ltd. (spherical particles comprised of melamine resin as cores and silica as shells with an average particle size of 6.5 μm and having a convexo-concave surface) | 15 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant)} | 50 |
| Layer structural clay mineral particles: Montmorillonite, Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 22 |
| Water soluble resin: aqueous 4% by weight sodium carboxymethyl cellulose solution (Reagent produced by Kanto Kagaku Co., Ltd.) | 15 |
| pH adjusting agent: aqueous 10% by weight sodium phosphate.dodecahydrate solution (Reagent produced by Kanto Kagaku Co., Ltd.) | 3 |
| Matting agent: Silton JC 40 (porous aluminosilicate particles having an average particle size of 4 μm, produced by Mizusawa Kagaku Co., Ltd.) | 11 |

TABLE 1-continued

| Materials | Amount (parts by weight) |
| --- | --- |
| Silicon-containing surfactant: FZ-2163 (produced by Nippon Unicar Co., Ltd.) | 1 |
| Pure water | 127.5 |

<<Hydrophilic Layer 2 Coating Solution>>Materials as shown in Table 2 were sufficiently mixed in the amounts shown in Table 2 while stirring, employing a homogenizer, and filtered to obtain hydrophilic layer 2 coating solution. Details of the materials are shown in Table 2, and in Table 2, numerical values represent parts by weight.

TABLE 2

| Materials | Parts by weight |
| --- | --- |
| Colloidal silica: Snowtex S (solid 30% by weight, produced by Nissan Kagaku Co., Ltd.) | 43.3 |
| Colloidal silica with a large particle size: MP-4540 (solid 40% by weight, produced by Nissan Kagaku Co., Ltd.) | 37.5 |
| Necklace shaped colloidal silica (alkali type): Snowtex PSM (solid 20% by weight, produced by Nissan Kagaku Co., Ltd.) | 97.5 |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40% by weight (including 0.2% by weight of dispersant)} | 22.5 |
| Layer structural clay mineral particles: Montmorillonite: Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 40 |
| Aqueous 4% by weight sodium carboxymethyl cellulose solution (Reagent produced by Kanto Kagaku Co., Ltd.) | 25 |
| Aqueous 10% by weight sodium phosphate.dodecahydrate solution (Reagent produced by Kanto Kagaku Co., Ltd.) | 5 |
| Porous metal oxide particles Silton AMT 08 (porous aluminosilicate particles having an average particle size of 0.6 μm, produced by Mizusawa Kagaku Co., Ltd.) | 30 |
| Porous metal oxide particles Silton JC 20 (porous aluminosilicate particles having an average particle size of 2 μm, produced by Mizusawa Kagaku Co., Ltd.) | 10 |
| Pure water | 522.5 |

<<Preparation of Image Formation Layer Coating Solution>>

Materials for the image formation layer coating solution are shown in Table 3.

TABLE 3

| Materials | Parts by weight |
| --- | --- |
| Aqueous solution of sodium polyacrylate (water soluble resin, average molecular weight: 300,000) AQUALIC DL422 (solid content 35%), produced by Nippon Shokubai Co., Ltd. | 21.4 |
| Microcrystalline wax emulsion A206 (solid content: 40% by weight, average particle size of 0.5 μm, produced by GIfUSHELLAC Co., Ltd.) | 62.5 |

TABLE 3-continued

| Materials | Parts by weight |
| --- | --- |
| Dispersion prepared by diluting with pure water carnauba wax emulsion A118 (having a solid content of 40% by weight, the wax having an average particle size of 0.3 μm, a melting viscosity at 140° C. of 8 cps, a softening point of 65° C., and a melting point of 80° C., produced by GIfUSHELLAC Co., Ltd.) to give a solid content of 5% by weight | 156.3 |
| Pure water | 759.8 |

<<Preparation of Back Coat Layer Coating Solution>>

TABLE 4

| Materials | Parts by weight |
| --- | --- |
| Binder: Acryl resin latex LE-1043 (solid content 36% by weight, produced by Dainippon Ink Manufacturing Co., Ltd. | 194 |
| Binder: Colloidal silica Snowtex XS (solid content 20% by weight, produced by Nissan Kagaku Co., Ltd.) | 125 |
| Matting agent: PMMA resin particle dispersion solution (average particle size 5.5 μm, solid content 45% by weight) | 11 |
| Pure water | 670 |

In the planographic printing plate material sample 1 obtained above, the average height of the protrusions and the protrusion frequency of the protrusions were determined according to the method described above. The results are shown in Table 5.

TABLE 5

| | Average Protrusion Height | *A | Protrusion Frequency | **B |
| --- | --- | --- | --- | --- |
| Image formation layer side surface | 4.5 μm | 1.0 μm | 1250/mm$^2$ | 298% |
| Back coat layer side surface | 3.5 μm | | 420/mm$^2$ | |

*"A" = (Average protrusion height on the image formation layer side) − (Average protrusion height on the back coat layer side)
**"B" = (Protrusion frequency on the image formation layer side) × 100 (%)/(Protrusion frequency on the back coat layer side)

Printing plate material samples (inventive) 2 through 7 (Inventive) and printing plate material samples (comparative) 1 through 3 were prepared in the same manner as above, except that the coating amount of the hydrophilic layer 1 and the back coat layer, average height of protrusions and protrusion frequency were varied as shown in Table 6.

TABLE 6

| Sample No. | Coating amount (g/m$^2$) | Average Protrusion Height (μm) | *A (μm) | Protrusion Frequency (number/mm$^2$) | **B (%) |
| --- | --- | --- | --- | --- | --- |
| Sample 2 | Hydrophilic Layer 1: 2.0 | 5.6 | 2.1 | 840 | 200 |
| | Back Coat Layer: 2.0 | 3.5 | | 420 | |

TABLE 6-continued

| Sample No. | Coating amount (g/m$^2$) | Average Protrusion Height (μm) | *A (μm) | Protrusion Frequency (number/mm$^2$) | **B (%) |
|---|---|---|---|---|---|
| Sample 3 | Hydrophilic Layer 1: 2.0 | 5.6 | 3.3 | 840 | 133 |
| | Back Coat Layer: 3.0 | 2.3 | | 630 | |
| Comparative Sample 1 | Hydrophilic Layer 1: 2.0 | 5.6 | 4.4 | 840 | 10 |
| | Back Coat Layer: 4.0 | 1.2 | | 820 | |
| Sample 4 | Hydrophilic Layer 1: 3.0 | 4.5 | 2.0 | 1250 | 198 |
| | Back Coat Layer: 3.0 | 2.5 | | 630 | |
| Sample 5 | Hydrophilic Layer 1: 3.0 | 4.5 | 3.0 | 1250 | 152 |
| | Back Coat Layer: 4.0 | 1.5 | | 820 | |
| Sample 6 | Hydrophilic Layer 1: 4.0 | 3.0 | 0.5 | 1520 | 241 |
| | Back Coat Layer: 3.0 | 2.5 | | 630 | |
| Sample 7 | Hydrophilic Layer 1: 4.0 | 3.0 | 1.5 | 1520 | 185 |
| | Back Coat Layer: 4.0 | 1.5 | | 820 | |
| Comparative Sample 2 | Hydrophilic Layer 1: 4.0 | 3.0 | 0.0 | 1520 | 287 |
| | Back Coat Layer: 2.5 | 3.0 | | 530 | |
| Comparative Sample 3 | Hydrophilic Layer 1: 4.0 | 3.0 | −0.5 | 1520 | 362 |
| | Back Coat Layer: 2.0 | 3.5 | | 420 | |

*"A" and **"B" represent the same as those denoted in Table 5 above, respectively.

A printing plate material sample (inventive) was prepared in the same manner as in printing plate material sample 1, except that STM-10500S with an average particle diameter of 10.5 μm (produced by Nissan Kagaku Co., Ltd.) was used as a matting agent instead of STM-6500S as described in Table 1 above.

In the planographic printing plate material sample 8 obtained above, an average protrusion height of the protrusions and a protrusion frequency of the protrusions were determined according to the method described above. The results are shown in Table 7.

TABLE 7

| | Average Protrusion Height | *A | Protrusion Frequency | **B |
|---|---|---|---|---|
| Image formation layer side surface | 8.0 μm | 4.5 μm | 1060/mm$^2$ | 252% |
| Back coat layer side surface | 3.5 μm | | 420/mm$^2$ | |

*"A" and **"B" represent the same as those denoted in Table 5 above, respectively.

The resulting printing plate material samples obtained above (samples 1 through 8 and comparative samples 1 through 3) were each cut into a size of 745 mm (width)×32 m (length), and wound around a spool having an inside diameter of 72 mm, made of cardboard with a thickness of 2.5 mm. Thus, a printing plate sample in roll form was prepared.

<Preparation of Printing Plate Sample>

The printing plate material sample was cut in a given size, wound around an exposure drum, and fixed on the drum under reduced pressure, and imagewise exposed employing a 808 nm laser with a beam spot diameter of 18 μm at an exposure energy on the sample surface of 300 mJ/cm$^2$ with a screen line number of 175 line and a resolution of 2400 dpi ("dpi" refers to a dot number per 2.54 cm). The exposure drum had a diameter of 270 mm, and a width of 850 mm. Exposure was carried out at a laser power on the sample surface of 270 mW, while rotating the drum at a rotation frequency of 430/minutes.

<Evaluation of Printing Plate Sample>

Printing was carried out under the following conditions employing the exposed printing plate material sample obtained above, and the sample was evaluated for various properties as a printing plate. Two kinds of printing ink described below were used.

Printing Press: DAIYA 1F-1 (produced by Mitsubishi Jukogyo Co., Ltd.)

Printing paper: Mu Coat (104.7 g/m$^2$) (produced by Hokuetsu Seishi Co., Ltd.)

Dampening solution: a 2% by weight solution of Astromark 3 (produced by Nikken Kagaku Kenkyusyo Co., Ltd.)

Printing ink: the following two inks were used.

Ink 1: Toyo King Hyecho M Magenta (produced by Toyo Ink Manufacturing Co.)

Ink 2: TK Hyecho SOY 1 (soy bean oil ink, produced by Toyo Ink Manufacturing Co.)

(Evaluation)

1) Developability on-Press

Printing was carried out employing the exposed printing plate sample obtained above in the same sequence as the printing sequence carried out employing a conventional PS plate, and the number of printing paper sheets printed from when printing started to when ink at the non-image portions was completely removed were determined.

A: The number was less than 10.

B: The number was from 10 to 50.

C: The number was more than 51.

2) Ink Stain Spots

Ink stain spots at non-image portions were observed employing a 100 powered magnifying glass, and evaluated according to the following criteria:

A: No ink stain spots were observed (the non-image portion area observed was 100 cm$^2$).

B: Ink stain spots at non-image portions were less than 0.05/cm$^2$.

C: Ink stain spots at non-image portions were not less than 0.05/cm$^2$.

3) Ink Transferability

Printing was carried out varying a supplied amount of a dampening solution or printing ink employing two kinds of inks above. Ink transferability to the printed paper was visually observed and evaluated according to the following criteria:

A: When ink was supplied in an amount of 50% of the normal supplied amount or in an amount of 150% of the normal supplied amount, excellent images were obtained.

B: When ink was supplied in an amount of 70% of the normal supplied amount or in an amount of 130% of the normal supplied amount, filling-up occurred at dotted images and density unevenness at solid images.

C: When ink was supplied in an amount of less than 130% of the normal amount, filling-up occurred at dotted images and density unevenness at solid images, (which was problematic for practical use.)

4) Printing Durability

Printing durability was expressed in terms of the number of printing paper sheets printed from when printing started till when a 3% dot image lacked not less than 50% of the dots was counted, and evaluated according to the following criteria: (Thirty thousand copies were printed.)

A: The number was not less than 20,000.

B: The number was from 15,000 to less than 20,000.

C: The number was less than 15,000.

The results are shown in Table 8.

TABLE 8

| Sample No. | Storage Temperature | Developability on-press | Ink Stain Spots | Ink Transferability Ink 1 | Ink Transferability Ink 2 | Printing Durability |
|---|---|---|---|---|---|---|
| Inventive 1 | * | A | A | A | A | A |
| | ** | A | A | A | A | A |
| Inventive 2 | * | A | A | A | A | A |
| | ** | A | A | A | A | A |
| Inventive 3 | * | A | A | A | A | A |
| | ** | A | A | A | A | A |
| Comparative 1 | * | A | A | A | A | A |
| | ** | B | C | A | B | B |
| Inventive 4 | * | A | A | A | A | A |
| | ** | A | A | A | A | A |
| Inventive 5 | * | A | A | A | A | A |
| | ** | A | A | A | A | A |
| Inventive 6 | * | A | A | A | A | A |
| | ** | A | A | A | A | A |
| Inventive 7 | * | A | A | A | A | A |
| | ** | A | A | A | A | A |
| Comparative 2 | * | A | B | A | B | B |
| | ** | B | B | B | C | B |
| Comparative 3 | * | B | C | A | B | B |
| | ** | C | C | B | C | C |
| Inventive 8 | * | B | A | B | B | A |
| | ** | B | A | B | B | A |

"*" represents storage at ordinary temperature.
"**" represents storage at high temperature.

As is apparent from Table 8, the inventive printing plate material samples provide good developability on-press, good ink transferability, and high printing durability, without no ink stain spots, even when stored at high temperature as well as ordinary temperature. Particularly, the samples comprising two or more kinds of particles having different particle diameter, in which the average particle diameter of the particles with larger particle is not more than 10 μm, provide more preferable results.

EFFECT OF THE INVENTION

The printing plate material in roll form of the on-press development type of the invention, even when the printing plate material is stored at high temperature, provides advantageous results that developability on-press, ink transferability, and printing durability are excellent and no ink stain spots are produced, which comprises the functional layer and the back coat layer, the functional layer containing first matting agents and having first protrusions formed from the first matting agents, and the back coat layer containing second matting agents and having second protrusions formed from the second matting agents, wherein an average protrusion height of the first protrusions is 0.5 to 5.0 μm higher than that of the second protrusions. Further, the printing plate material of the invention, in which the matting agents contained in the functional layer have an average particle diameter of not more than 10 μm, proved results.

What is claimed is:

1. A printing plate material in roll form of the on-press development type comprising a support, a functional layer including a hydrophilic layer containing metal oxide particles and a thermosensitive image formation layer containing heat melt or heat fusible particles, provided on one side of the support, and a back coat layer provided on the other side of the support, the functional layer containing first matting agents having an average particle diameter of 4.0 to 10 μm in an amount of from 0.2 to 5.0 g/m$^2$ and having first protrusions formed from the first matting agents, and the back coat layer containing second matting agents having an average particle diameter of 3.0 to 8 μm in an amount of from 0.01 to 1.0 g/m$^2$ and having second protrusions formed from the second matting agents, wherein an average protrusion height of the first protrusions is 0.5 to 5.0 μm higher than that of the second protrusions.

2. The printing plate material in roll form of the on-press development type of claim 1, wherein the ratio of a protrusion frequency of the first protrusions to that of the second protrusions is from 130 to 500%.

3. The printing plate material in roll form of the on-press development type of claim 1, wherein the functional layer has a thickness of from 0.5 to 5 μm, and the back coat layer has a thickness of from 0.5 to 5.0 μm.

4. The printing plate material in roll form of the on-press development type of claim 1, wherein the hydrophilic layer has a thickness of from 1.0 to 3.5 μm, and the thermosensitive image formation layer has a thickness of from 0.3 to 1.5 μm.

5. The printing plate material in roll form of the on-press development type of claim 1, wherein the hydrophilic layer contains a light-to-heat conversion material.

6. The printing plate material in roll form of the on-press development type of claim 1, wherein the hydrophilic layer contains the first matting agents.

7. The printing plate material in roll form of the on-press development type of claim 1, wherein the functional layer consists of the hydrophilic layer and the thermosensitive image formation layer being provided on the support in that order.

* * * * *